United States Patent [19]

Engelstein et al.

[11] Patent Number: 4,487,820
[45] Date of Patent: Dec. 11, 1984

[54] BATTERY HOLDER FOR COIN CELLS

[75] Inventors: Charles Engelstein, South Orange, N.J.; David L. Kassel, New York; Harry Goodman, Rockville Centre, both of N.Y.

[73] Assignee: Memory Protection Devices, Inc., Farmingdale, N.Y.

[21] Appl. No.: 516,884

[22] Filed: Jul. 25, 1983

[51] Int. Cl.³ .............................................. H01M 2/10
[52] U.S. Cl. ...................................... 429/100; 429/1
[58] Field of Search ............................... 429/96–100, 429/1, 176, 178; 354/80, 81; 368/88, 204

[56] References Cited

U.S. PATENT DOCUMENTS

| 3,473,966 | 10/1969 | Fritch | 429/98 |
| 3,597,913 | 8/1971 | Fujimori | 429/1 |
| 3,856,577 | 12/1974 | Oki et al. | 429/96 |
| 4,053,688 | 10/1977 | Perkins et al. | 429/98 |
| 4,218,522 | 8/1980 | Motoyoshi | 429/97 |
| 4,230,777 | 10/1980 | Gatto | 429/97 |
| 4,371,595 | 2/1983 | Suwa | 429/98 |

Primary Examiner—Anthony Skapars
Attorney, Agent, or Firm—Bucknam and Archer

[57] ABSTRACT

A battery holder for a coin cell provided with a casing which receives the coin cell against its bottom and laterally constrains the cell by a peripheral barrier wall. One pole of the cell is engaged by an electrical contact extending across the casing bottom, and the other pole of the cell is engaged by another electrical contact extending across the cell in resilient contact with the other pole thereof.

5 Claims, 4 Drawing Figures

BATTERY HOLDER FOR COIN CELLS

BACKGROUND OF THE INVENTION

This invention relates in general to battery holders, and more particularly to a battery holder for a coin cell.

More recently, the coin cell has been utilized in computers, microprocessors, and other electronic units and systems. In particular, there has arisen a need for a battery holder for the coil cell battery, that can be readily mounted upon a printed circuit board, and the invention provides a battery holder that is easily received on a printed circuit board.

Coin cell type battery holders are known in the prior art as exemplified by U.S. Pat. Nos. 4,053,688 to Perkins et al; 4,230,777 to Gatto; 4,371,595 to Suwa; 4,218,522 to Motoyashi; and 4,223,076 to Terada. All of these prior patents describe battery holders that lack certain of the features of the battery holder according to the present invention.

Basically, the invention provides a battery holder for a coin cell, which comprises a casing, a first electrically conductive contact that engages one pole of the coin cell, and a second electrically conductive contact that engages the other pole thereof. The casing has a bottom and a peripheral barrier configured to receive the coin cell against the bottom and laterally constrained by the peripheral barrier. The first conductive contact extends along the bottom of the casing to engage one pole of the coin cell, and the second conductive contact extends above the bottom of the casing, and also above the coin cell to engage the other pole thereof. Thus, the invention provides a battery holder with only three basic separate parts.

DESCRIPTION OF A PREFERRED EMBODIMENT

Figure 1:
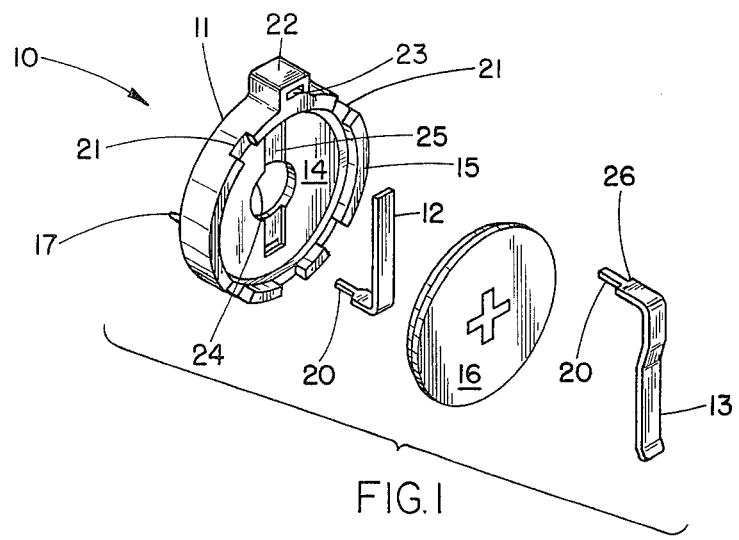
FIG. 1 is an exploded perspective view of a battery holder according to a peripheral embodiment of the invention, as seen in relation to a typical coin cell battery held thereby.

From FIG. 1 it can be noted that the battery holder (10) of the invention is simply constructed from three basic parts; a casing (11), a first electrically conductive contact (12), and a second electrically conductive contact (13).

Figure 2:
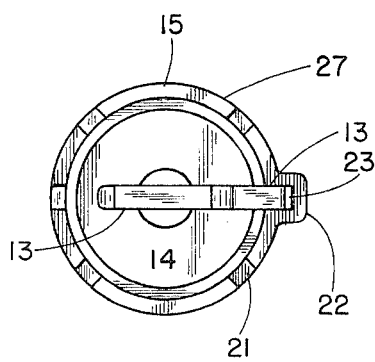
FIG. 2 is a top view of the battery holder of FIG. 1, as seen without the battery.
Figure 3:
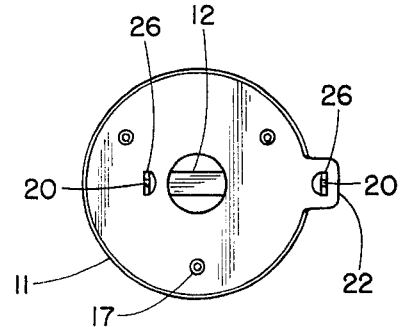
FIG. 3 is a bottom view of the battery holder of FIG. 1, also as seen without the battery.
Figure 4:
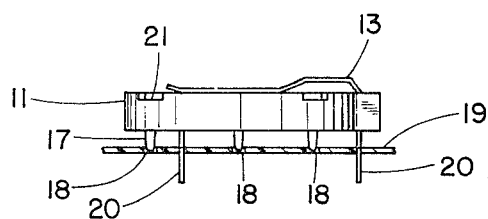
FIG. 4 is a side view, partly in section, of the battery holder shown by FIGS. 2 and 3, as seen installed upon a typical support plate, and with a typical coin cell battery installed.

As shown by FIGS. 2, 3 and 4, these basic parts (11, 12 and 13) cooperate to make a battery holder (10) in which the casing (11) has a bottom (14) and a peripheral barrier wall (15) disposed to receive a coin cell (16) against the bottom (14) and laterally constrained by the peripheral barrier wall (15). The first contact (12) extends along the bottom (14) of casing (11) to engage one pole, typically the negative pole, of coin cell (16). The second contact (13) extends above the bottom (14) of casing (11) to engage the other pole, typically the positive pole, of coin cell (16).

Because the battery holder (10) is designed for use with printed circuit boards as a support means, the contacts (12 and 13) extend through the bottom (14) of the casing (11) and project therefrom. In addition, there are provided on the bottom (14) of casing (11) at least one, and preferably a plurality of projecting members (17) that are positioned for insertion into the holes (18) of a printed circuit board (19), as seen in FIG. 4. These members (17) simply serve to align the battery holder (10) and give it some additional shear resistance to detachment from the board (19) beyond that provided by the tips (20) of the contacts (12, 13) that are received through other holes (18) of the board (19). These contact tips (20) can be of any suitable length for making solder connections thereto on the opposite side of board (19).

Alternatively, instead of being arranged for insertion into the holes (18) of printed circuit board (19), the members (17) can be laid out so as to maintain the bottom (14) in a fixed spacing apart from the printed circuit board (19). This can be done simply by either sizing the diameter of members (17) so that they are too large to fit through the printed circuit board holes (18), or by sizing the spacing of members (17) so that they do not intercept any holes (18) when the tips (20) are extended through holes (18).

Expediently, the contacts (12, 13) are made of resilient metal strip of generally constant width, except at the tips (20), which are of reduced width. In the portions of contacts (12, 13) as project from beneath the bottom (14), there can extend beyond such bottom, the edges (26) of the contacts (12, 13). These edges (26) will generally abut against the printed circuit board (19) and will not pass through the holes (18) thereof as do the tips (20). Accordingly, the length of the projecting members (17) can be set so that if desired, they extend into and through the holes (18) of printed circuit board (19) to stabilize the emplacement of battery holder (10).

To accomodate easy removal of the coin cell (16) from the holder (10), there is provided at least one, and preferably a plurality of openings (21) in the peripheral wall (15), through which a suitable tool (not shown) can be inserted to pry out the cell (16).

Casing (11) is generally circular to accomodate holding a circular coin cell (16), but could be varied in shape to suit the configuration of whatever coin cell that would be used.

The positive or second contact (13) is preferably received through a transversely projecting portion (22) of casing (11). Accordingly, the projecting portion (22) has a slot (23) through which contact (13) is inserted and held thereby. Positive contact (13) extends across the major portion of the coin cell (16) to secure it within the casing (11). Both the positive contact (13) and the underlying negative contact (12) are resilient in their engagement with the coin cell (16). To allow a certain degree of flexure of the first, or negative, contact (12), the casing bottom (14) has an aperture (24) and contact (12) extends across said aperture (24) and can flex thereinto when pressed by the coin cell (16).

To secure the contact (12) against being forced out of alignment with the negative terminal of the coin cell (16), the contact (12) is seated within a recess (25) in the casing bottom (14).

An important feature of the invention resides in the top (27, FIG. 2) of peripheral barrier wall (15) being beveled to match the outer circumference of standard coin cells. Since standard coin cells have a greater circumference around the positive side than around the negative side, the beveled construction prevents contact being made to the negative terminal (12) if the coin cell (16) is incorrectly inserted with its positive pole facing the negative terminal. This feature prevents possible cell damage if the coin cell is incorrectly inserted into the holder.

What is claimed is:

1. A battery holder for a coin cell, which comprises a casing having a bottom and a peripheral barrier means disposed to receive a coin cell against the bottom and laterally constrained by the peripheral barrier means; a first electrically conductive contact extending along said bottom of the casing to engage one pole of the coin cell, and a second electrically conductive contact extending above the bottom of the casing to engage the other pole of the coin cell, and comprises at least one projecting member on the bottom of said casing disposed for insertion into a matching hole of a support means to secure the battery holder thereupon.

2. A battery holder for a coin cell, which comprises a casing having a bottom and a peripheral barrier means disposed to receive a coin cell against the bottom and laterally constrained by the peripheral barrier means; a first electrically conductive contact extending along said bottom of the casing to engage one pole of the coin cell, and a second electrically conductive contact extending above the bottom of the casing to engage the other pole of the coin cell, wherein said casing is generally circular to accomodate holding a circular coin cell, and including a transversely projecting portion that receives and holds said second contact.

3. A battery holder for a coin cell, which comprises a casing having a bottom and a peripheral barrier means disposed to receive a coin cell against the bottom and laterally constrained by the peripheral barrier means; a first electrically conductive contact extending along said bottom of the casing to engage one pole of the coin cell, and a second electrically conductive contact extending above the bottom of the casing to engage the other pole of the coin cell, wherein said casing bottom has an aperture and said first contact extends across said aperture to allow flexure of the first contact into said aperture.

4. A battery holder for a coin cell, which comprises a casing having a bottom and a peripheral barrier means disposed to receive a coin cell against the bottom and laterally constrained by the peripheral barrier means; a first electrically conductive contact extending along said bottom of the casing to engage one pole of the coin cell, and a second electrically conductive contact extending above the bottom of the casing to engage the other pole of the coin cell, wherein said casing bottom has a recess that receives and laterally constrains said first contact.

5. A battery holder for a coin cell, which comprises a casing having a bottom and a peripheral barrier means disposed to receive a coin cell against the bottom and laterally constrained by the peripheral barrier means; a first electrically conductive contact extending along said bottom of the casing to engage one pole of the coin cell, and a second electrically conductive contact extending above the bottom of the casing to engage the other pole of the coin cell, wherein said peripheral barrier means has a top surface which is configured to match the circumference of a standard coin cell whereby no electrical contact can be made to said first electrically conductive contact by said standard coin cell if it is inserted into said holder with a pole of opposite polarity to that of said first electrically conductive contact facing said first electrically conductive contact.

* * * * *